United States Patent [19]

Tabourier et al.

[11] Patent Number: 4,590,445
[45] Date of Patent: May 20, 1986

[54] DEVICE FOR GENERATING A FREQUENCY MODULATED SIGNAL

[75] Inventors: Remy Tabourier, Sceaux; Jean M. Quintric, Paris, both of France

[73] Assignee: Thomson-CSF, Paris, France

[21] Appl. No.: 620,623

[22] Filed: Jun. 14, 1984

[30] Foreign Application Priority Data

Jun. 28, 1983 [FR] France ................. 83 10676

[51] Int. Cl.⁴ .................................. H03C 3/00
[52] U.S. Cl. ....................... 332/18; 332/16 R; 328/61
[58] Field of Search ............. 332/9 R, 14, 16 R, 18; 331/23; 307/106; 328/59, 61, 63; 343/55 A

[56] References Cited

U.S. PATENT DOCUMENTS

| | | | |
|---|---|---|---|
| 2,774,872 | 12/1956 | Howson | 250/36 |
| 3,364,437 | 1/1968 | Loposer et al. | 331/1 |
| 3,621,403 | 11/1971 | Seiy | 328/61 |
| 4,492,936 | 1/1985 | Albarello et al. | 332/16 R |

FOREIGN PATENT DOCUMENTS 0088669 9/1983 European Pat. Off. .
2281001 2/1976 France .

*Primary Examiner*—Eugene R. Laroche
*Assistant Examiner*—Robert J. Pascal
*Attorney, Agent, or Firm*—Cushman, Darby & Cushman

[57] ABSTRACT

A device for generating a frequency-modulated signal according to a predetermined modulation law includes a digital generator that, from a clock signal, generates an output signal s(t) and a error signal ($S_e$). The signal s(t) is a signal in which the duration of each alternance is an integer multiple of the clock period. The error signal ($S_e$) represents the modulation errors of the output signal s(t) with respect to the theoretical output signal ($S_t$) modulated according to the predetermined law. An error correction device receives the output signal s(t) and is controlled by the error signal ($S_e$) and corrects the modulation errors and provides a corrected output signal.

17 Claims, 12 Drawing Figures

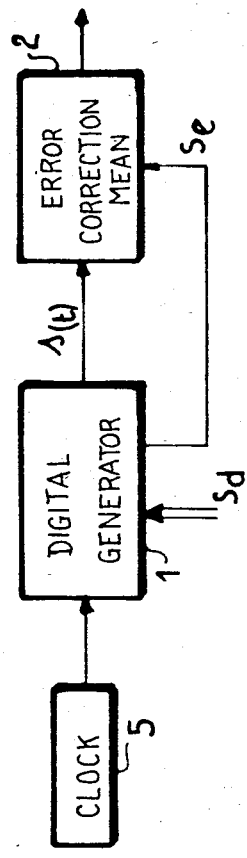
FIG_1
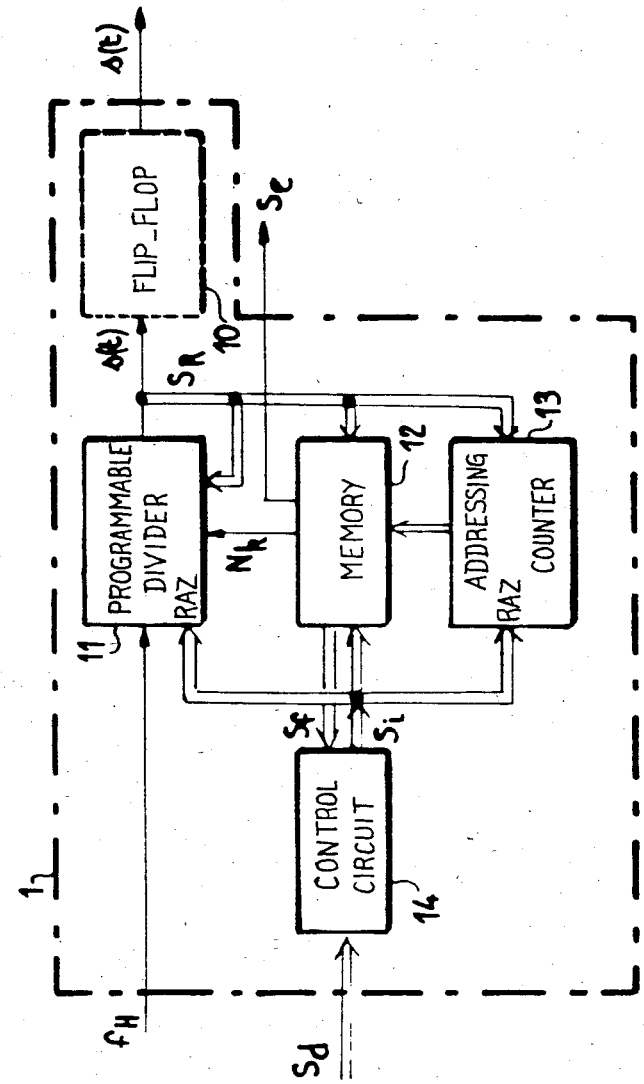
FIG_2

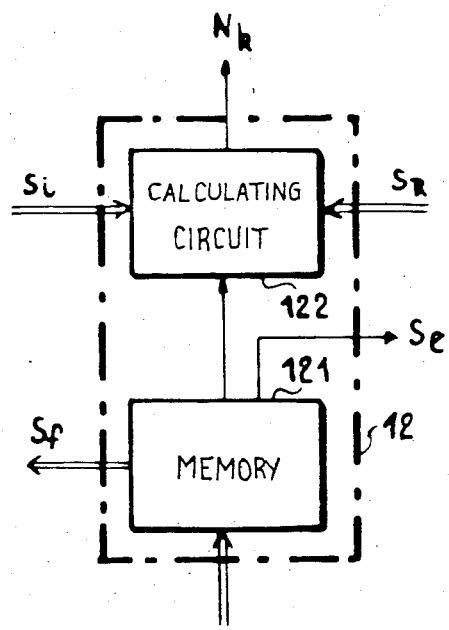
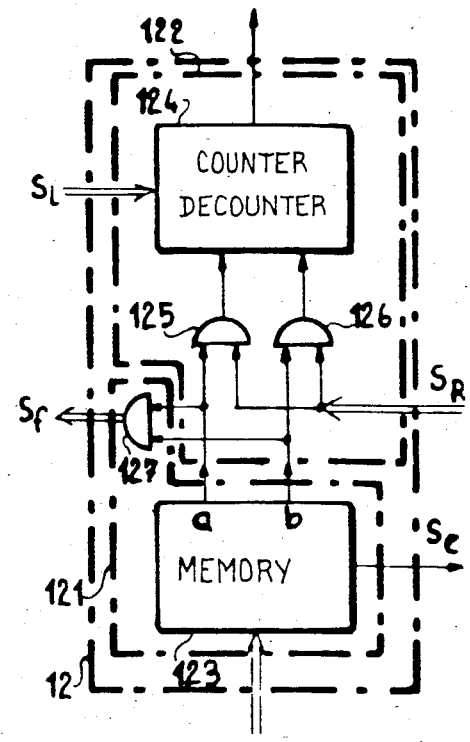
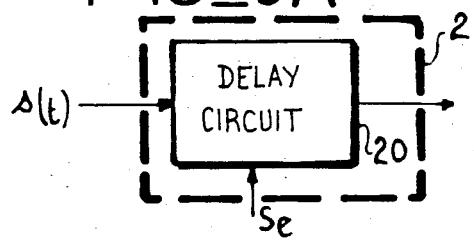
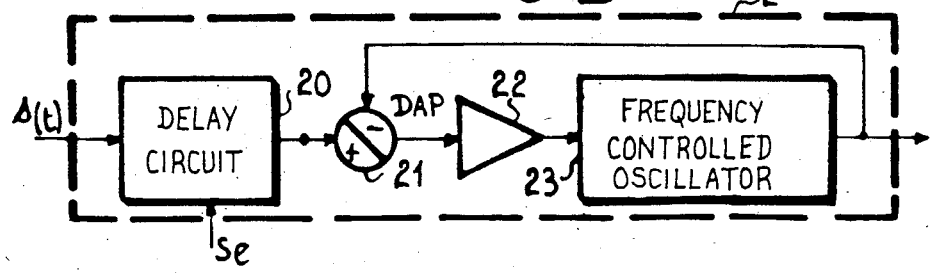

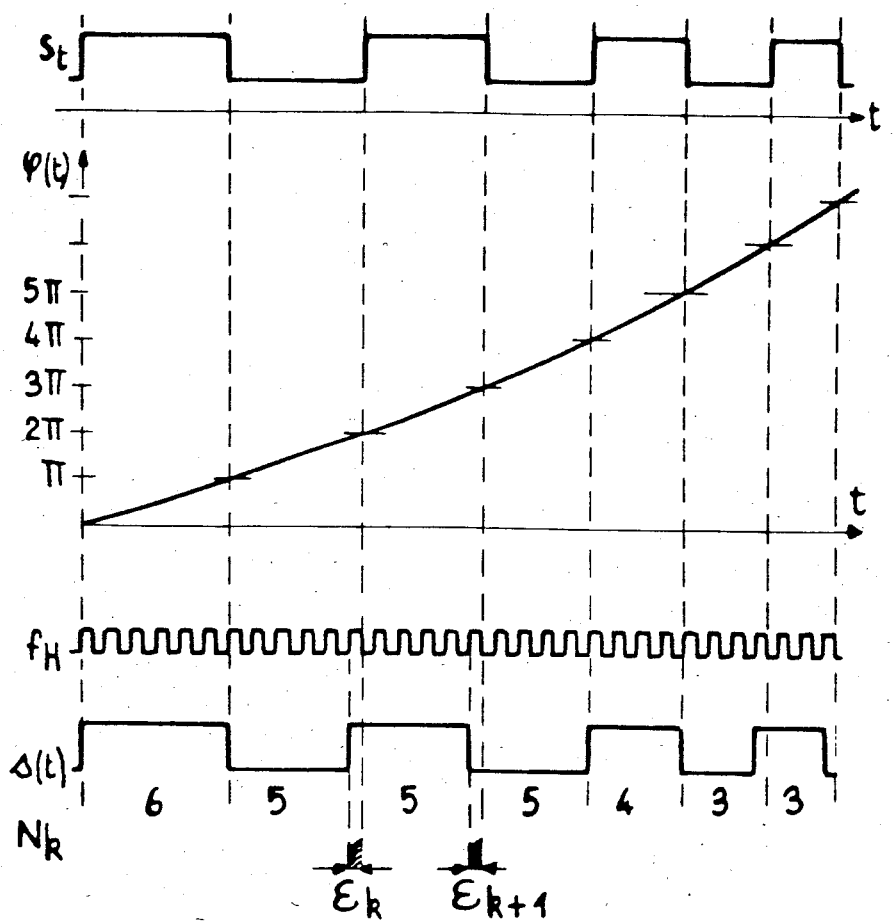
FIG_4
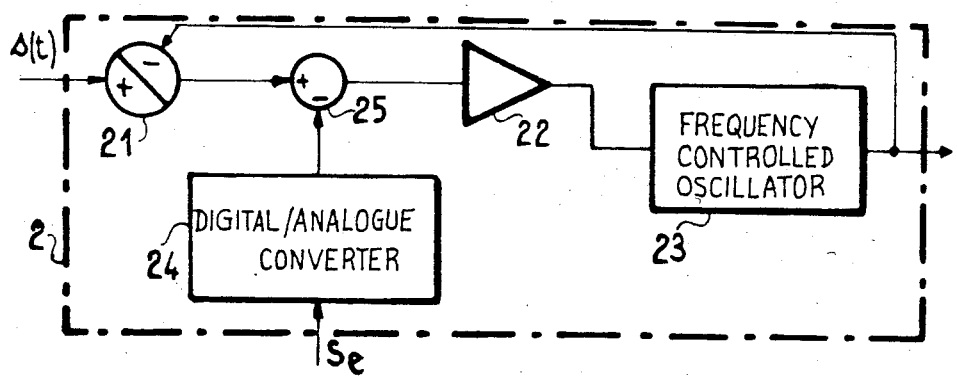
FIG_7

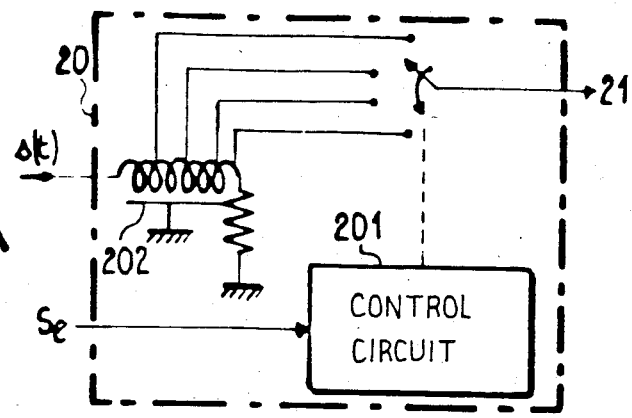
FIG_6-A
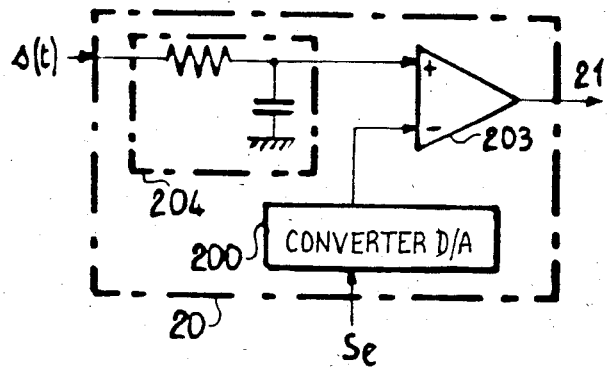
FIG_6-B
(PRIOR ART)
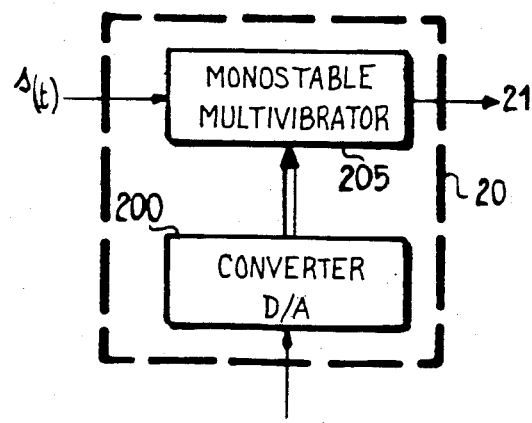
FIG_6-C
(PRIOR ART)

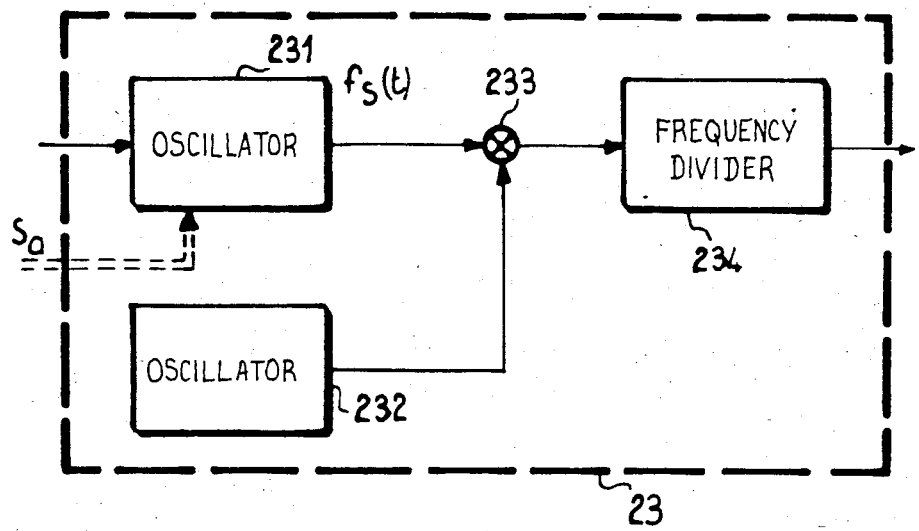
FIG_8

0
DEVICE FOR GENERATING A FREQUENCY MODULATED SIGNAL

BACKGROUND OF THE INVENTION

Field of the Invention

The present invention concerns a device for generating a frequency-modulated signal.

Certain systems such as altimeters or pulse compression radars emit a frequency-modulated signal according to a predetermined modulation law. The control oscillators that equip them must follow this law with the greatest possible precision and stability.

Several processes for obtaining a frequency-modulated signal of a limited duration are known; they operate as follows:
- by modulating directly a frequency oscillator controlled by a voltage, called voltage control oscillator (VCO), and by possibly completing by a feedback loop;
- by mechanically controlling an oscillator element, in general a capacitor armature;
- by using a dispersive line of predetermined characteristics, fed by a brief pulse, which allows the obtaining of a signal of a limited duration;
- in the case of a linear modulation, by combining a phase loop and a delay line of which the group delay is known, such a process being described in the article of W. J. CAPUTI, "Stabilized linear FM generator" which appeared in IEEE trans. on A.E.S., September 1973.

The carrying out of the processes described hereinabove requires the use of high-quality analog components and delicate operation if a good stability with temperature and ageing is desired.

SUMMARY OF THE INVENTION

The present invention concerns a precision device generating a frequency-modulated signal according to a predetermined law: it is constituted by an entirely digital generator supplying a frequency-modulated signal answering to a law close to the theoretical modulation law desired. The signal delivered by this generator therefore comprises systematic errors inherent in its principle. This is why it delivers parallel-wise a signal representing the modulation errors of the signal with respect to the predetermined modulation law.

According to the invention, the device for generating a frequency-modulation signal according to a predetermined law is characterized in that it comprises in series:
a digital generator that, from a clock signal of period $1/f_H$ and an external control signal, delivers on the one hand an output signal s(t) of which each alternance presents a variable duration ($N_oT$, $N_1T$, ..., $N_kT$, $N_nT$) that is an integer multiple of the clock period, and, on the other hand, an error signal ($S_e$) representing the errors of the said output signal s(t) with respect to the theoretical signal ($S_t$) modulated according to the predetermined law; and,
error correction means supplied with the said output signal and controlled by the error signal.

An object of the present invention is to overcome the drawbacks of the processes of the prior art cited hereinabove.

The device according to the invention requires no adjustment and allows the generation with high precision of every form of frequency modulation. It also presents the advantage of being simple, inexpensive, reliable and insensitive to temperature and to ageing.

BRIEF DESCRIPTION OF THE DRAWINGS

The present invention will be better understood by reading through the detailed description given hereinunder with reference to the annexed drawings which represent:

FIG. 1 shows the block diagram of the digital device according to the invention;

FIG. 2 shows a detailed embodiment of the digital generator subassembly of the device according to the invention;

FIGS. 3A and 3B show two detailed embodiments of one part of the digital generator of FIG. 2;

FIG. 4 shows the representation of the phase error between the real signal at the output of the digital generator of FIG. 2 and the theoretical signal;

FIGS. 5A and 5B shows two detailed embodiments of a second sub-assembly of the device according to the invention for time correction of the errors of the signal generated by the first sub-assembly;

FIGS. 6A, 6B and 6C show three detailed embodiments of a circuit of the second sub-assembly represented by FIGS. 5A and 5B;

FIG. 7 shows another detailed embodiment of the second sub-assembly of the device according to the invention for phase correction of the errors;

FIG. 8 shows a detailed embodiment of another circuit of the second sub-assembly represented by FIGS. 5A, 5B or 7.

DETAILED DESCRIPTION OF THE PREFERRED EMBODIMENT

FIG. 1 represents the block diagram of the digital device according to the invention for the generation of a frequency-modulated signal according to a predetermined modulation law and represented by the signal $S_T$ in FIG. 4.

A wholly digital generator 1 (of which a preferential embodiment is illustrated by FIG. 2) generates a frequency-modulated signal from a clock signal $f_H$ supplied by a clock 5. The beginning of the sequence, repetitive or not, is eventually controlled by an external signal Sd.

The modulated signal s(t) generated by the digital generator 1 presents, with respect to a theoretical signal $S_t$ that ought to have been obtained with a modulation reproducing very exactly the predetermined law of modulation, the phase errors represented by a signal $S_e$ supplied by the digital generator 1.

The output of the digital generator 1 is connected to the first input of error correction means 2 (two embodiments of this circuit 2 are illustrated by FIGS. 5A, 5B and 7), the second input of which receives the error signal $S_e$, generated by the digital generator 1.

FIG. 2 represents the circuit 1 digitally generating the frequency-modulated signal according to a law very close to the predetermined theoretical law.

The signal is obtained by division, in a programmable divider 11, of the frequency $f_H$ of the clock signal from clock 5. The divider 11 delivers a signal s(t) of which each cycle presents a variable duration $N_oT$, $N_1T$, ..., $N_kT$, ..., $N_nT$ with $N_k$ (k=0, ..., n) being any natural integer number supplied by the memory means 12 and $$T = (1/f_H)$$

the period of the clock signal. According to a preferential embodiment, the programmable divider 11 is a decounter of which the operation is described hereinunder.

A bistable flip-flop 10 can be eventually connected at the output of the programmable divider 11 in order to generate a signal s(t) of which the form factor is close to ½.

The impulse signal $S_R$ sampled at the output s(t) of the divider 11 controls the memory means 12, an addressing counter 13 and the programmable divider 11 itself.

The (n+1) rank-numbers $N_k$(k=0 to n), allowing a first approach of the modulated theoretical signal, are supplied to the programmable divider 11 by memory means 12.

The addressing counter 13 controls the emission of the successive rank-numbers of division $N_k$(k=0, . . . ,n) by memory means 12 towards the programmable divider 11. The reinitialization of the address counter 13, of the programmable divider 11 and of the memory means 12 is ensured by a signal Si applied on their return-to-zero (RAZ) input and emitted by a control circuit 14 that can be in a preferential manner a R/S flip-flop; this flip-flop is supplied by the external signal $S_d$ delivered at the beginning of the sequence and by a signal $S_f$ delivered at the end of the sequence, both signals being supplied by memory means 12 at the end of the emission of the (n=1) rank-numbers of division $N_k$(k=0, . . . ,n). Producing the signal $S_d$ from the signal $S_f$ realizes a periodic generator.

If the divider 11 is a programmable decounter as in a preferred embodiment of the invention, it receives from memory means 12 a value $N_R$ and is charged at the instant $t_k$, by a value $N_k-1$. Each clock pulse reduces its contents by one unit. When the decounter displays the value "0", it delivers a pulse and receives for the following cycle the value $N_{k+1}$ of the memory means 12. It displays the value $N_{k+1}-1$ and as hereinabove is decremented by one unit at each clock stroke. It delivers a pulse when it reaches the value "0". It is thus charged by the value $N_{k+2}-1$ and so on until the series of rank-numbers $N_k$ are exhausted and the desired sequence terminated.

According to another embodiment, the programmable divider circuit 11 can be a counter which, after having been charged by a value $N_M+1-N_k$, ($N_M$ being the maximum value that can be displayed by the counter and $N_k$ the rank-number of the division supplied by the memory means 12), carries out from this value an incrementation of one unit at each clock cycle until value $N_M$ is reached. At the same time as the programmable counter displays the value $N_M$, it delivers a pulse that also controls the emission by memory means 12 of the following rank-number of division $N_{k+1}$ and the loading of the value $N_M+1-N_{k+1}$ in the counter and so on thereafter.

Further to the rank-numbers of division $N_k$, the memory means 12 delivers a digital signal $S_e$ that represents the differences between the pulse signal s(t) of variable period generated in a digital manner by the divider 11 and the theoretical frequency-modulated signal that ought to have been obtained and which consequently is constituted by the whole of the errors provoked by such a generation. These errors are determinant, as will be explained herein-under for the operation of the device represented in FIG. 1.

In FIGS. 5A and 5B, representing two embodiments of the error correction means 2, the determinant errors of the signal provoked by the digital generator 1 are corrected directly in time. The digital signal $S_e$ delivered by the memory means 12 (FIG. 2) is a time error signal. In the case of FIG. 7, the errors are corrected in phase.

In the case of FIG. 7, the error correction means 2 comprises in series an amplitude/phase detector 21, supplied at a first input by the signal provoked by the digital generator 1 (signal s(t), an adder circuit 25, an amplifier 22 and a frequency-controlled oscillator circuit 23. The output signal of the detector 21 is applied at the positive input of adder circuit 25 of which the negative input receives the error signal $S_e$ converted into an analog signal by a digital/analog converter 24. The output of the oscillator circuit 23 is relooped on the second input of the detector 21.

In FIG. 5A, the error signal $S_e$ controls a delay circuit 20 of which the input receives the signal s(t) provoked by the digital generator 1 and which supplies the delay signal, thus corrected.

According to the embodiment of FIG. 5B, the approach of the desired modulation law can be further improved by applying the said delayed signal, delivered by the delay circuit 20, to the input of a phase loop that comprises in series an amplitude/phase detector 21, an amplifier 22, and a frequency-controlled oscillator circuit 23. The output of the oscillator circuit 23 is relooped on the second input of the amplitude/phase detector 21.

The delay applied by the circuit 20 and controlled by the error signal $S_e$ can be obtained in different ways, as illustrated, for example, by FIGS. 6A, 6B and 6C.

FIG. 6A represents a delay circuit constituted by a delay line 202 having multiple outputs that each correspond to a delay and which are selected by the error signal $S_e$ through the intermediary of a control circuit 201.

FIGS. 6B and 6C represent two embodiments, non-limitative and known to the man skilled in the art, of a continuous variation delay circuit, controlled by a voltage supplied by the conversion of the digital error signal $S_e$, through the intermediary of a digital/analog converter 200.

In FIG. 6B, the delay circuit is a comparator 203 with variable threshold determined by the converter circuit 200. The delay circuit 203 is supplied by the output signal s(t) of the generator 1, previously filtered in a filter 204 formed from a resistance and a capacitor.

In FIG. 6C, the delay circuit is a classical monostable multivibrator 205 of which the variable delay is controlled by the converter circuit 200.

In the case of FIG. 5A, according to the embodiment of FIGS. 6A, 6B or 6C, the delay circuit 20 preferentially causes a constant systematic delay, allowing the application of negative corrections. The phase loop 21, 22, 23, such as represented in FIG. 5B, only acts to carry out the transpositions, if necessary. Indeed, the digital generator 1, to which is associated a delay circuit 20, is independent and is no longer sensitive to the characteristics of the amplitude/phase detector 21; the adjustments of the various elements of the digital generator 1/delay circuit 20 assembly are independent. The controlled oscillator circuit 23 can be a simple frequency-controlled oscillator which can be realized in the manner illustrated by FIG. 8.

The embodiment according to FIG. 8 comprises an oscillator 231 frequency-controlled by the amplified signal at the output of the circuit 22 of FIGS. 5B and 7, possibly completed by an anticipation signal $S_a$ representative of the desired and predetermined modulation law. The output signal of the controlled oscillator 231 and the predetermined frequency signal supplied by an oscillator 232 are applied to the input of a mixer 233, of which the output supplies a frequency divider 234.

If it is supposed that the frequency of the signal s(t) provoked by the digital generator 1 of FIG. 1 is designated by $f_e(t)$, the frequency $f_s(t)$ of the output signal of the controlled oscillator 231 is given by:

$$f_s(t) = L.f_e(t) \pm f_o,$$

formula in which:

$f_o$ is the steady frequency of the oscillator 232; and,
L the rank-number of the frequency division realized in the divider 234.

The case L=1 and $f_o=0$ corresponds to the case where the circuit 23 only comprises the controlled oscillator 231.

The operating principle of the digital device according to the invention, illustrated by FIG. 1 is the following, with reference also to FIGS. 2 and 7.

A frequency-modulated or phase-modulated signal can be read y=A.sin {α(t)} where dα/dt is not constant and varies according to a predetermined law.

The intervals $\Delta t_k = t_{k+1} - t_k$ between the successive instants $t_{k+1}$ and $t_k$ for which d(t) is an integer multiple of $2\pi$ are therefore not constant. In order to digitally provoke in the generator 1 a signal of which the frequency modulation follows as close as possible a predetermined modulation law, and this from the clock frequency $f_H$, which is steady and rather high, it is necessary to obtain an approximation of each interval $\Delta t_k$ by an integer number $N_k$ of clock periods $T = 1/f_H$. It is possible to take for $N_k$ the integer the closest to $\Delta t_k/T$ but it is preferable to take $N_k = M_{k+1} - M_k$ where $M_{k+1}$ and $M_k$ are integers the closest to $t_{k+1}/T$ and $t_k/T$ respectively. The precision will be better. The principle of the digital generator 1 will be explained herein-under in detail with reference to FIGS. 2, 3A, 3B and 4.

The digital generator 1 therefore generates a pulse signal s(t) of which the frequency varies at each period but remains equal to the quotient of the clock signal $f_H$ by an integer $N_k$, variable from one period to the other according to a predetermined sequence, repetitive or not, in order that the obtained frequency modulation is the closest possible to the predetermined modulation law.

As a general rule, for the desired modulation law, phase errors result on the signal issued from the digital generator 1.

In the case of a linearly frequency-modulated signal, these errors can be revealed by mixing the signal supplied by the digital generator 1 and this same delayed signal. At the output of the mixer, a low-pass filter only allows to pass the signals of which the frequency is the difference of the frequencies on the two inputs. The frequency of the output signal is constant and a spectral analysis of the signal obtained reveals the phase noise that accompanies the useful line.

In the case of any frequency-modulated signal, the signal delivered cannot be filtered by a passive circuit.

A known process consists in using a frequency-controlled oscillator in a phase loop in which the pass band is fairly narrow in order to reject the errors due to a frequency far removed from the instantaneous signal of the useful signal.

The errors due to the differences that exist between $t_k/T$ and $M_k$, the closest integer, have effects analogous to those of a noise, but are perfectly determinant. Indeed, the numbers $t_k/T$ are perfectly known, as well as the numbers $\epsilon_k = t_k/T - M_k$ which range between $-0.5$ and $+0.5$.

In the internal operation of the phase loop 21, 22, 23, the error signal is $S_e - S_\delta$, where $S_e$ and $S_\delta$ are respectively the phase error signals of the digital generator 1 and of the controlled oscillator circuit 23. The error signal $S_e - S_\delta$ modified by the loop filter modulates the controlled oscillator circuit 23 by thus producing errors $S_\delta$. Operating is in a closed loop: the high frequency components of $S_e$ are therefore not in the error signal $S_\delta$, the loop 21, 22, 23 having a limited pass band.

With further reference to FIG. 7, the case $S_\delta = 0$ corresponds to an ideal operation where the controlled oscillator circuit 23 presents exactly the frequency modulation required. The loop error is that of the digital generator 1. In fact, this can be foreseen by calculation upon the determination of the various $N_k$. It is therefore sufficient to store also in the memory means 12 (FIG. 2) the quantities $\epsilon_k = t_k/T - M_k$ in digital form, which requires increasing memory capacity. Each value $\epsilon_k$ read can thus be, for example, converted into analog form, according to the embodiment of FIG. 7. The whole of the values $\epsilon_k$ is designated by $S_e$, the digital signal of error. The error signal $S_e$ is substracted from the error signal of the phase loop downstream from the amplitude/phase detection in the amplitude/phase detection circuit. In the ideal case, this difference is zero and does not modulate the controlled oscillator circuit 23, which a posteriori justifies the hypothesis $S_\delta = 0$.

In practice, $S_\delta$ is not strictly zero and comprises, among others, the error necessary to cause the operation of the phase loop once the anticipation signal $S_a$ is absent or imperfect.

The only adjustment required in this case is that of balancing the output gradients (in volts/radian) of the phase detector 21 and of the digital/analog converter 24.

The principle of the digital generator 1 was roughly described herein-above. It should be recalled that it generates a signal, the frequency of which varies from one cycle to another, the frequency remaining equal for each period of rank k (between two instants $t_k$ and $t_{k+1}$) to the quotient of the clock signal $f_H$ by an input number $N_k$, variable from one period to another according to a predetermined sequence. The frequency modulation obtained must be as close as possible, provided that the herein-above mentioned condition with respect to the theoretical modulation law required is fulfilled.

In order to obtain correct precision, the values of the numbers $N_k$ are fairly high, of about one hundred, for example, due to an appropriate choice of the clock frequency. It therefore necessitates in this case a large number of binary coding elements (bits) in the memory means 12.

For numerous applications, the successive values $N_k (k = 0, \ldots, n)$ differ at most by one unit, for example:

$$N_k - N_{k-1} = \Delta N_k$$

with $\Delta N_k \epsilon \{-1,0,1\}$. It is therefore interesting to calculate each value $N_k$ from the preceding value $N_k = N_{k+1} + \Delta N_k$ where only the initial value $N_o$ and the successive values of $\Delta N_k$ are stored in memory means 12. Two binary elements are sufficient to store in memory the variation $\Delta N_k$, for example:

| | |
|---|---|
| 00 | $N_k = 0$ |
| 01 | $N_k = 1$ |
| 10 | $N_k = -1$ |
| 11 | end of sequence $= S_f$ |

This technique can be extended to a coding on three binary elements allowing the coding of the variations $\Delta N_k$ chosen from among the following values:

$$N_k \epsilon (-3, -2, -1, 0, 1, 2, 3)$$

and the end-of-sequence signal $S_f$, or the coding on a greater number of binary elements.

FIGS. 3A and 3B illustrate two preferential embodiments of the memory means 12, respectively corresponding to the general case of coding variations $\Delta N_k$ and to the more particular case where the variations $[\Delta N_k]$ are at most equal to 1.

In FIG. 3A, the memory means 12 comprise a read-only memory 121, (or ROM) containing the different variations $\Delta N_k (k=0, \ldots, n)$, existing between two successive division rank-numbers ($N_{k-1}$, $N_k$). This memory circuit 121 supplies successively variations $\Delta N_o, \ldots, \Delta N_k, \ldots, \Delta N_n$ at the rhythm imposed by the address counter 13. A calculating circuit 122, initialized at the value $N_o$ by the signal $S_i$ supplied by the control circuit 14, receives the values supplied by the memory circuit 121 and provides the totals:

$$N_0 = N'_0 + \Delta N_0$$

$$N_1 = N_0 + \Delta N_1$$

$$N_2 = N_1 + \Delta N_2$$

$$N_k = N_{k-1} + \Delta N_k$$

$$N_n = N_{n-1} + \Delta N_n$$

corresponding to the successive division numbers of frequency that supply the programmable divider 11 at the rhythm given by the pulse signal $S_R$.

The memory circuit 121 supplies, with the emission of the value $N_n$ (11 as in the example herein-under), the end-of-sequence signal $S_f$ when all the values $\Delta N_k (k=0$ to n) have been read.

In FIG. 3B, the variations $[\Delta N_k]$ are at most equal to 1. Two binary elements a and b are sufficient. The memory circuit 121 comprises a read-only memory 123, emitting the two binary elements a and b, and an AND gate 127 that supplies the end-of-sequence signal $S_f$ when the binary elements a and b are simultaneously equal to 1 (as indicated in the example herein-above).

The calculating circuit 122 comprises in this case a counter-decounter 124 and two AND gates 125 and 126, that each receive on a first input the pulse signal $S_R$ (at the output of the programmable divider 11) and on a second input the binary elements a and b respectively and that control, according to the pulse signal $S_R$, the application of the binary elements a and b at the input of the counter-decounter 124. This counter-decounter 124 is initialized at $N_o'$ by the signal $S_i$ supplied by the control circuit 14; the value that is displayed is incremented or decremented until the value $N_k$ following the binary elements a, b applied at its input and such as defined, for example herein-above, i.e.

| a | b | $\Delta N_k$ |
|---|---|---|
| 0 | 0 | 0 |
| 0 | 1 | 1 |
| 1 | 0 | -1 |

This value $N_k$ is thus emitted towards the programmable divider 11.

As mentioned herein-above, the instants $t_k$ are those at which the phase $\phi(t)$ is a multiple integer k of $2\pi$: $\phi(t_k) = k.2\pi$.

But it is also possible to use, for instants $t_k$, those for which $\phi(t_k)$ is a multiple integer of $\pi$. The memory means 12 thus contain a double number of data $N_k$ or $\Delta N_k$. A simple bistable flip-flop 10 (FIG. 2) supplied by output pulses s(t) of the programmable divider 11 thus delivers a substantially square signal, the rising fronts of which correspond to $$\phi(t) = k.2\pi$$

and the falling fronts to $\phi(t) = (2k+1).\pi$. This is represented by FIG. 4 which illustrates the phase $\phi(t)$ curve, the required modulated theoretical signal $S_t$, the frequency clock signal $f_H$, and the signal s(t) delivered by the digital generator 1.

On the representation of the signal s(t) thus obtained have been mentioned the numbers $N_k$ and the determinant errors $\epsilon_k$ forming the error signal $S_e$.

A device allowing the reproduction, with an excellent spectral purity of a modulation law of any frequency, repetitive or not, is thus realized.

The present invention applies, inter alia, to pulse compression radars, homing devices, altimeters, telemeters, spectrum analyzers. The contents of the memory being able to be reread indefinitively in both directions, the present invention is applicable to continuous (or not) Doppler radars for distance measurement.

What is claimed is:

1. A device for generating a frequency-modulation signal according to a predetermined law, comprising in series:
    a digital generator that, from a clock signal of period $T = 1/F_H$ (where $F_H$ is the frequency of the clock signal) and an external control signal ($S_d$), delivers on the one hand an output signal s(t) of which each alternance presents a variable duration ($N_0T$, $N_1T$, ..., $N_kT$, $N_nT$) that is an integer multiple of the clock period, and, on the other hand, an error signal ($S_e$) representing modulation errors of said output signal with respect to a theoretical output signal ($S_t$) modulated according to the predetermined law; and
    error correction means supplied with said output signal and controlled by said error signal (Se) for correcting said modulation errors and providing a corrected signal.

2. A device according to claim 1, wherein the error correction means comprises a delay circuit that, controlled by the said error signal ($S_e$), applies a variable delay to said output signal.

3. A device according to claim 2, wherein the error correction means further comprises, at the output of the delay circuit and connected in series;
   an amplitude/phase detector supplied at a first input by the delayed output signal;
   an amplifier; and
   a frequency-controlled oscillator circuit having an output which is applied to a second input of the amplitude/phase detector.

4. A device according to claim 2, wherein said delay circuit is a delay line with multiple outputs selected by a commutation circuit.

5. A device according to claim 2 wherein said delay circuit is a continuous variation device controlled by the error signal ($S_e$) through the intermediary of a digital/analogue converter.

6. A device according to claim 5, wherein said delay circuit comprises a comparator with a variable threshold, supplied by the output signal, delayed or not, filtered by a filtering circuit.

7. A device according to claim 5, wherein said delay circuit comprises a variable delay monostable multivibrator.

8. A device according to claim 1, wherein said error correction means comprises in series:
   an amplitude/phase detector supplied on a first input by the signal s(t) delievered by the digital generator;
   an adder circuit receiving on a positive input an output signal from said amplitude/phase detector and on a negative input the error signal ($S_e$) through the intermediary of a digital/analog converter; and
   an oscillator circuit frequency controlled by an output signal from said adder circuit, through the intermediary of an amplifier, an output of the oscillator circuit being applied to a second input of the amplitude/phase detector.

9. A device according to claim 3, wherein said oscillator circuit comprises:
   a first oscillator frequency controlled by the signal s(t) delivered by the digital generator;
   a second oscillator providing a steady frequency signal;
   a mixer receiving at a first input a variable frequency signal delivered by said first oscillator and at a second input said steady frequency signal delivered by said second oscillator; and,
   a frequency divider circuit that receives an output signal from said mixer and provides an output signal to said second input of the amplitude/phase detector.

10. A device according to claim 3, wherein said oscillator circuit receives an anticipation signal ($S_a$) representing a predetermined theoretical frequency modiculation law to be generated, corresponding to said predetermined law.

11. A device according to claim 1, wherein said digital generator comprises:
    a programmable divider generating a signal s(t) of which each period of rank number k is an integer multiple $N_k$ higher than 1, k varying from 0 to n, of the period T of the clock signal, and is as close as possible to a corresponding period of the theoretical signal ($S_t$);
    memory means supplying (n+1) integers ($N_o, \ldots, N_k, \ldots, N_n$) successively to the programmable divider and the said error signal ($S_e$);
    addressing means for controlling the memory means; and
    control means for actuating said device and its interruption at the end of read-out of the contents of the memory means, and the reinitialization of the programmable divider, the memory means and the addressing means being both controlled by a signal sampled at the output of the said programmable divider.

12. A device according to claim 1, wherein the programmable divider is a decounter of which the contents undergo, at each clock cycle, a decrementation of one unit from the value $N_k-1$, the integer $N_k$ being supplied by memory means at the beginning of each counting cycle, until the value 0 indicating the end of the counting cycle of rank k and corresponding to the emission by the decounter of a pulse that coincides with the Nth and last clock cycle of the kth counting cycle, this pulse provoking the charge in the decounter of the value $N_{k+1}-1$, the integers $N_k$ with k ranging between 0 and n, being successively supplied by memory means addressed by the addressing means.

13. A device according to claim 11, wherein the programmable divider includes a counter of which the contents undergo at each clock cycle an incrementation of one unit from the value $N_{M+1}-N_k$ until the value $N_M$ indicating the end of the counting cycle of rank k and corresponding to the emission by the counter of one impulse that coincides with the Nth and last clock cycle of the kth counting cycle, this pulse provoking the charge in the counter of the value $N_M+1-N_{k+1}$, the integers $N_k$ being successively supplied by memory means and $N_M$ being the maximum given value that can be displayed by the counter.

14. A device according to claim 11, wherein the memory means comprises:
    a memory circuit containing n+1 variations existing between two successive division rank numbers ($N_{k.1}, N_k$), and n+1 errors ($\epsilon_o, \ldots, \epsilon_k, \ldots, \epsilon_n$) at n+1 respective addresses controlled by the addressing means and successively delivering from each address, of rank k varying from 0 to n, the error ($\epsilon_k$) that forms the error signal ($S_e$) to said error correction means, and the variation ($\Delta N_k$) to said programmable divider; and
    a calculating circuit that is initialized at an initial value $N'_o$, positive integer, by said control means and which, controlled by said sampled signal successively calculates the n+1 rank ($N_o = N'_o + \Delta N_o$, $N_i = N_o + \Delta N_1, \ldots, N_k = N_{k-1} + \Delta N_k \ldots, N_n = N_{n-1} + \Delta N_n$) of the divisions carried out by the programmable divider, each rank-number k ($N_k$) being equal to the total of the preceding rank-number of division ($N_o$) of rank 0 equal to the sum of the initial value $N'_o$ and of the variation value ($\Delta N_o$) of rank 0, and said memory circuit delivering at the same time as the last variation ($\Delta_n$) an end-of-sequence signal ($S_f$) to the control means.

15. A device according to claim 14, wherein successive ranks of division ($N_o, \ldots, N_k, \ldots, N_n$) differ at most by one unit, and wherein the memory circuit comprises an addressable read-only memory, emitting each variation in the form of two binary elements (e, b), and an AND gate combining the said two binary elements (a, b) in order to form the end-of sequence signal ($S_f$), and wherein the calculating circuit comprises a counter/decounter circuit initialized at value $N'_o$ by said control means and supplied by said two binary elements (a, b) each combined with the signal sampled at the output of the programmable divider in an AND gate.

16. A device according to claim 11, wherein said control means include a bistable R/S flip-flop, supplied on its inputs (S, R), respectively, by the external control signal ($S_d$) and the end-of-sequence signal ($S_f$) and delivers an initialization signal ($S_i$) to the programmable divider, the memory means and the addressing means.

17. A device according to claim 11, wherein said digital generator further comprises, downstream from the programmable divider, a bistable flip-flop delivering a signal of which the rising fronts and the falling front respectively correspond to the instants wherein the phase of the signal s(t) delivered by the digital generator is an even or uneven multiple respectively of $\pi$.

* * * * *